United States Patent
Wang et al.

(10) Patent No.: US 6,727,594 B2
(45) Date of Patent: Apr. 27, 2004

(54) POLYBENZOXAZINE BASED WAFER-LEVEL UNDERFILL MATERIAL

(75) Inventors: Lejun Wang, Chandler, AZ (US); Song-Hua Shi, Phoenix, AZ (US); Tian-An Chen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/038,710

(22) Filed: Jan. 2, 2002

(65) Prior Publication Data

US 2003/0122241 A1 Jul. 3, 2003

(51) Int. Cl.[7] .............................................. H01L 29/40
(52) U.S. Cl. ....................................... 257/778; 257/687
(58) Field of Search ................................ 257/687, 778; 523/445, 458; 428/413

(56) References Cited

U.S. PATENT DOCUMENTS

| | | | | |
|---|---|---|---|---|
| 4,619,500 A | * | 10/1986 | Ahne et al. | 428/1.2 |
| 6,143,467 A | * | 11/2000 | Hsu et al. | 430/270.1 |
| 6,160,042 A | * | 12/2000 | Ishida | 523/445 |
| 6,265,776 B1 | | 7/2001 | Gilleo | |
| 6,376,080 B1 | * | 4/2002 | Gallo | 428/413 |
| 6,414,729 B1 | * | 7/2002 | Akiyama et al. | 349/38 |
| 6,437,026 B1 | * | 8/2002 | Garrett | 523/458 |
| 6,573,122 B2 | | 6/2003 | Standing | |
| 2003/0052414 A1 | * | 3/2003 | Cowens et al. | 257/778 |

FOREIGN PATENT DOCUMENTS

JP  11060687  *  3/1999

* cited by examiner

*Primary Examiner*—David Nelms
*Assistant Examiner*—Tu-Tu Ho
(74) *Attorney, Agent, or Firm*—Blakely, Sokoloff, Taylor & Zafman LLP

(57) ABSTRACT

A polybenzoxazine based wafer-level underfill material. The material may be provided to a surface of a semiconductor wafer. The semiconductor wafer may then be sawed into individual chips. The polybenzoxazine based underfill material may be for use between a chip and a package substrate.

13 Claims, 6 Drawing Sheets

POLYBENZOXAZINE BASED WAFER-LEVEL UNDERFILL MATERIAL

BACKGROUND

The present invention relates to semiconductor packaging. In particular, the present invention relates to wafer-level semiconductor packaging.

BACKGROUND OF THE RELATED ART

In the fabrication of microchips, semiconductor wafers are processed and sliced into individual chips. The chips may then be used in a wide variety of devices. For example, a chip may be used in an electronic device by being electronically coupled to a printed circuit board (PCB) of the device. However, prior to such an electronic coupling packaging takes place. Packaging is the manner by which a semiconductor wafer is separated into individual chips that are then protected in various package forms. The protective packages prevent damage to the chip and provide an electrical path to the circuitry of the chip.

During packaging an underfill material, generally an epoxy adhesive, is applied between a surface of an individual chip and a substrate of the package. The underfill material secures and stabilizes the chip to the substrate. The surface of the chip includes electronic coupling mechanism, such as an array of metal bumps coupled to the internal circuitry of the chip. The coupling mechanism of the chip is configured to also electrically couple to the package through bond pads on the substrate. The underfill material is applied in liquid form and fills the space between the chip and substrate.

Dispensing of underfill material is accomplished by a heated dispensing needle. The dispensing needle is precisely positioned with respect to the chip and package. The position of the needle can greatly affect the resulting performance of the chip. For example, if underfill material contacts the opposite surface of the chip, longevity of the chip is likely affected. Additionally, if the chip is contacted by the dispensing needle, the chip will most likely be severely damaged. On the other hand, if the needle is too far from the chip, the space between the chip and the substrate may not be adequately filled with the underfill material, leading to air voids that can affect performance of the chip. In addition to dispensing needle position, the dispensing rate and viscosity of the underfill material should be accounted for to ensure uniform filling.

Generally, all of the above concerns are addressed for each and every functional chip to be packaged of the original semiconductor wafer. This can be a time consuming, expensive, and fairly inefficient process. As a result, some recent packaging developments are drawn toward wafer-level packaging. That is, rather than dispensing underfill material between each chip and each substrate, one by one, a heated liquid form of the underfill material is dispensed once, on the entire wafer. The underfill material is then cooled and solidifies and the wafer cut into individual chips. Each chip can then be individually placed on a substrate of a package. A reflow process to allow the formation of interconnects between the chip and the substrate is followed by curing of the underfill material to secure the chip to the substrate. Such wafer-level packaging can potentially save time and money.

While wafer-level packaging may be preferred from a time and efficiency standpoint, the underfill material is subject to a new set of circumstances. That is, the underfill material is no longer introduced in the confines between a chip surface and a substrate. Rather, it is delivered to an entire wafer surface, cooled, cut, and later must undergo additional curing and cooling during reflow. Unfortunately, conventional underfill material, such as the epoxy adhesive described above, has a tendency to gel and partially solidify as it is applied to the semiconductor wafer. This increases the likelihood of uneven application across the wafer surface. This can translate into uneven application to several chips simultaneously, resulting in potential adhesion and electrical coupling problems between the chip and the substrate. A single non-uniform or uneven application of underfill to a single wafer may now hamper the performance of several, if not all, chips of the wafer. Additionally, once cooled, the epoxy adhesive is particularly susceptible to damage upon sawing of the wafer, further hampering chip performance.

DETAILED DESCRIPTION

Descriptions of methods of wafer-level semiconductor packaging and semiconductor packages follow. Aspects of embodiments are described and illustrated by the accompanying drawings. While embodiments are described with reference to a particular chip and a certain package, the embodiments are applicable to any wafer-level packaging. Embodiments can be particularly useful when a uniform film-forming underfill is required that is to be cooled with negligible shrinkage, sawed in a fracture resistant manner. Embodiments include a method of applying a polybenzoxazine based underfill material to an entire wafer surface and sawing the wafer into individual chips for packaging.

Figure 1:
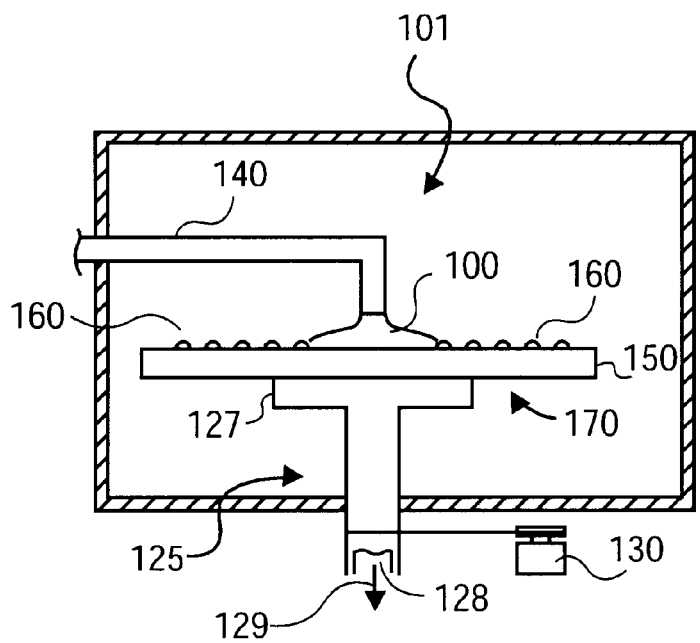
FIG. 1 is a partially sectioned side view of a wafer in a dispensing apparatus for delivery of a polybenzoxazine based underfill material to a surface of the wafer.

Referring now to FIG. 1, a dispensing mechanism 101 is shown for delivery of a polybenzoxazine (PBZ) based underfill material 100 to a surface of a semiconductor wafer 170. In the embodiment shown, the dispensing mechanism 101 includes a spinning mechanism 125 to encourage even distribution of PBZ based underfill material 100. However, in other embodiments, alternate dispensing mechanisms for meniscus coating, stencil printing, and other techniques are employed to deliver and distribute the PBZ based underfill material 100.

As described further herein, delivery of a PBZ based underfill material 100 to an entire semiconductor wafer 170 allows for efficient wafer-level packaging. Embodiments of the wafer-level packaging described take advantage of PBZ based underfill material 100 properties particularly suited for wafer-level packaging.

The semiconductor wafer 170 can include a monocrystaline silicon substrate 150 to act as a platform for various integrated circuits, or chips 250 separated by scribe lines. The chips 250 include an arrangement of transistors and capacitors and include metal lines for electrical coupling separated by inter-layer dielectric material. Additonally, as shown, a surface of the semiconductor wafer 170 includes a conductive mechanism such as electrical contacts (e.g. conductive bumps 160). The conductive bumps 160 are electrically coupled to the inner circuitry of the chips 250 and of conductive materials such as tin lead solder, lead-free solder, or other conventional materials.

Continuing with reference to FIG. 1, the semiconductor wafer 170 is centrally positioned within the dispensing mechanism 101 atop a platform 127 of a spinning mechanism 125. As set forth in the flowchart of FIG. 7 positioning the semiconductor wafer 170 in this manner on the spinning mechanism 125 may be the beginning of a wafer-level packaging process that utilizes a PBZ-based underfill material 100. The spinning mechanism 125 is employed to obtain a uniform distribution of PBZ based underfill material 100 as described further herein. The spinning mechanism 125 includes a hollowed portion 128 that runs up through the platform 127 and terminates adjacent the placed semiconductor wafer 170. A vacuum (shown by arrow 129) is applied to the hollowed portion 128 as shown, by conventional means. The vacuum 129 secures the semiconductor wafer 170 atop the platform 127.

With the vacuum 129 applied as shown, a rotating motor 130 coupled to the spinning mechanism 125 is powered to rotate the spinning mechanism 127. The rotating motor 130 and spinning mechanism 125 can be operated to rotate the semiconductor wafer 170 in a clockwise or counterclockwise direction about a vertical axis of the spinning mechanism 125. Embodiments of the spinning mechanism 125 may operate from between about 25 rpm and about 1,500 rpm. However, depending on a variety of factors, rpm may fall outside of this range. As described below, the rpm employed will be chosen in part depending on properties displayed by the PBZ based underfill material 100 as it is delivered.

Unlike epoxy, embodiments of the PBZ based underfill material 100 are near solid or solid at room temperature. The PBZ based underfill material 100 is liquid when reaching a temperature of between about 50° C. and about 100° C., preferably at about 80° C. As discussed below, PBZ based underfill material 100 is dispensed by the dispensing mechanism 101 in liquid form. In one embodiment, in order to maintain a liquid form of the PBZ based underfill material 100, the semiconductor wafer 170 is heated to between about 50° C. and about 100° C. prior to introduction of the PBZ based underfill material 100.

Figure 7:
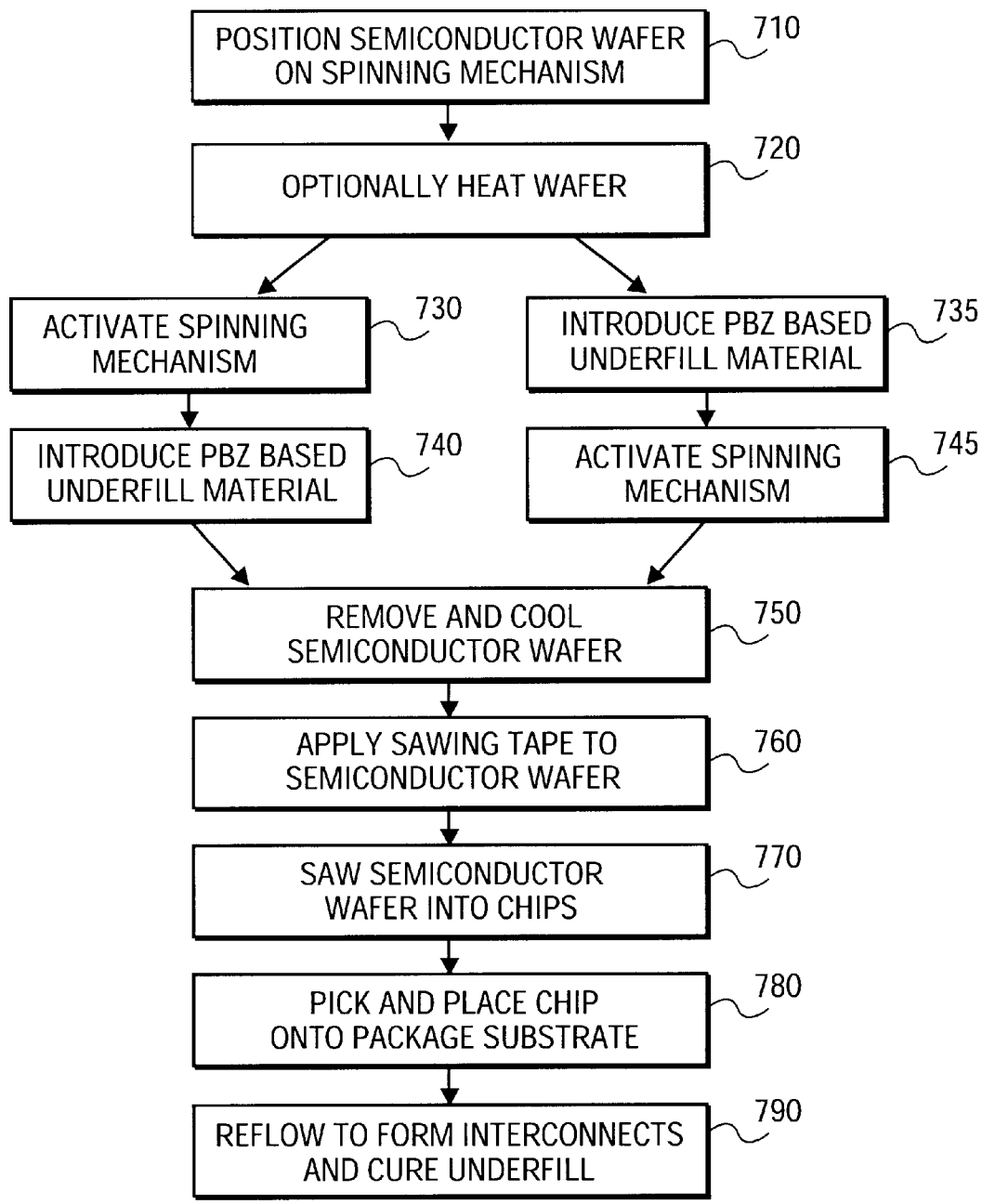
FIG. 7 is a flow chart summarizing an embodiment of wafer-level packaging.

As referenced in the flowchart of FIG. 7, such optional heating 720 may be applied as soon as the semiconductor wafer 170 is positioned and the dispensing mechanism 101 sealably secured. In this manner, the PBZ based underfill material 100 does not begin to solidify upon contacting the surface of the semiconductor wafer 170. In one embodiment, the semiconductor wafer 170 is heated by introducing and maintaining the desired temperature throughout the entire dispensing mechanism 101 following placement of the semiconductor wafer 170. For example, the dispensing mechanism 101 may be insulated and coupled to a conventional heating element to obtain and maintain a desired temperature. The semiconductor wafer 170 will be heated to the desired temperature over a time dependant on the make-up of the semiconductor wafer 170 and the strength of the heating element used.

In another embodiment, the semiconductor wafer 170 is heated to any temperature above room temperature to slow down any cooling which may take place as the PBZ based underfill material 100 contacts the semiconductor wafer 170. Additionally, the PBZ based underfill material 100 exhibits a low coefficient of thermal expansion (CTE) that is between about 50 ppm/° C. and about 60 ppm/° C. as compared to conventional epoxy adhesives which are generally at least about 65 ppm/° C. Therefore, when the PBZ based underfill material 100 is liquefied by heating it exhibits a CTE that is closer to that displayed by materials nearer the surface of a conventional semiconductor wafer 170, such as the tin lead solder of the conductive bumps 160 which may exhibit a CTE of about 25 ppm/° C. As a result, less stress is placed on the heated semiconductor wafer 170 as the heated and liquefied PBZ based underfill material 100 is introduced. Additionally, where a filler, such as silicon dioxide ($SiO_2$) is used to further lower the CTE, less filler will be required where a PBZ-based underfill material 100 is used in place of conventional epoxy.

Continuing with reference to FIG. 1, as indicated above, the semiconductor wafer 170 is centrally positioned on the platform 127. Thus, the semiconductor wafer 170 may spin uniformly during operation of the spinning mechanism 125. With the semiconductor wafer 170 spinning a delivery tube 140 releases liquid PBZ based underfill material 100 from a separate location to above the wafer substrate 150 and conductive bumps 160. As shown in the flowchart of FIG. 7, the spinning 730 may precede the introduction 740 of the PBZ based underfill material in a method described here. The spinning of the spinning mechanism 125 during delivery as described, acts to uniformly spread the PBZ based underfill material 100 as it contacts the semiconductor wafer 170.

In an alternate embodiment also shown in the flowchart of FIG. 7, the semiconductor wafer 170 and the spinning mechanism 125 remain stationary as the PBZ based underfill material 100 is introduced (see also 735, FIG. 7). The spinning mechanism 125 is subsequently activated to spin the semiconductor wafer 170 and enhance spreading as shown at 745 of FIG. 7. As described below, the determination of when to activate the spinning mechanism 125 relative to the time of introduction of the PBZ based underfill material 100, is a matter of design choice, determined, in part, by characteristics displayed by the particular PBZ based underfill material 100 utilized.

The PBZ based underfill material 100 is particularly suited to uniformly cover a surface of a semiconductor wafer 170. This is due to PBZ based underfill material 100 remaining stable and not curing as it is heated to between about 50° C. and about 100° C. and delivered to the surface of the semiconductor wafer 170. Therefore, the PBZ based underfill material 100 may be heated to liquefy and lower viscosity to encourage uniform spreading without concern over curing. In an embodiment where stencil printing is used uniform delivery is further ensured. In any case, the PBZ based underfill material 100 avoids clumping and aggregating together and more naturally tends to spread out uniformly across a surface such as of the semiconductor wafer 170. Additionally, this may allow the semiconductor wafer 170 to be shelved for a period of time at room temperature without cooling and without concern over accidental gelling or curing In the embodiment described, a uniform spreading of the PBZ based underfill material 100 as it contacts a surface of the semiconductor wafer 170 is enhanced by the spinning of the semiconductor wafer 170. As described above, the semiconductor wafer 170 is centrally located and spun about a vertical axis of the spinning mechanism 125. The PBZ based underfill material 100 is introduced from the delivery tube 140 to a surface of the semiconductor wafer 170 and in line with the vertical axis of the spinning mechanism 125. In this manner, the PBZ based underfill material 100 is spread uniformly across the surface of the semiconductor wafer 170 from its center in an outward direction.

Parameters for uniform delivery of PBZ based underfill material 100 may be tailored to the properties of the particular PBZ based underfill material 100 that is to be spread. For example, rate of introduction to the surface of the semiconductor wafer 170, rpm of the spinning mechanism 125, the duration of spin, the temperature to maintain in the delivery apparatus 101 or at the semiconductor wafer 170, and even when to start the spin, relative to the time of introduction to the surface of the semiconductor wafer 170, may be determined based on properties of the particular PBZ based underfill material 100, such as the particular temperature at which it melts and the particular temperature at which it begins to cure (described further herein).

Embodiments of PBZ based underfill material 100 include PBZ or mixtures that include PBZ, and copolymers of PBZ with other materials. Mixtures may include fillers of silicon oxide, alumina oxide, boron nitride, and other substances. PBZ copolymers may include epoxy, phenolic, cyanate ester, bismaleimide or other substances. The substances and materials may be combined with PBZ to specifically tailor the properties of the PBZ based underfill material 100 used. As noted above, delivery parameters may be chosen based in part on the properties of the PBZ based underfill material 100. Similarly, the properties of the PBZ based underfill material 100 may be adjusted as noted here, to correlate with desired parameters of delivery. In one embodiment the PBZ based underfill material 100 includes, by weight, from about 30% to about 90% PBZ resin, from about 10% to about 50% of a hardener resin, such as epoxy or phenol, from about 0.1% to about 5% of a catalyst such as imidazole, from about 0.1% to about 1% surfactant, and from about 0.1% to about 3% of a coupling agent.

Once the PBZ based underfill material 100 is dispensed and evenly distributed, the spinning mechanism 125 and other portions of the dispensing mechanism 101 are shut down. The coating of PBZ based underfill material 100 is uniform due to the advantageous properties of PBZ based materials as described above. A single application of the PBZ based underfill material 100 has provided a uniform film of underfill to every chip 250 (see FIG. 2) of the semiconductor wafer 270 in an efficient and cost-effective manner.

Figure 2:
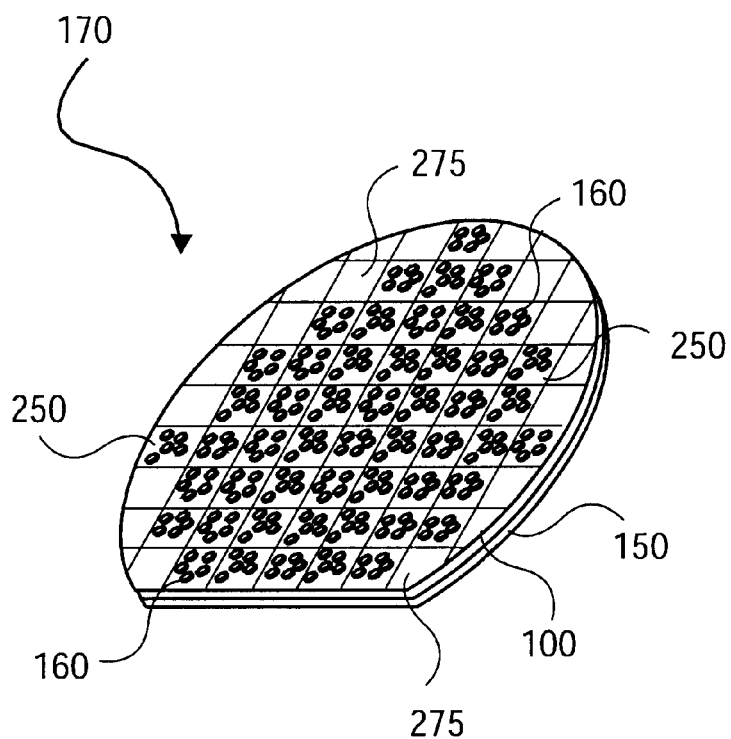
FIG. 2 is a perspective view of the wafer of FIG. 1 with a polybenzoxazine based underfill material coating at a surface of the wafer.

Referring to FIGS. 1 and 2 and at 750 of the flowchart of FIG. 7, the semiconductor wafer 170 is removed from the dispensing mechanism 101 and cooled. The PBZ based underfill material 100 displays a solid or near solid form as a coating on the wafer substrate 150. In the case of conventional epoxy adhesives, significant shrinkage would occur during such a cooling. This would place stress near the surface of the underlying substrate, generally a silicon or silicon oxide based material, which fails to correspondingly exhibit such shrinkage. However, the PBZ based underfill material 100 as described here undergoes substantially negligible shrinkage during cooling. Therefore, cooling and solidifying of the PBZ based underfill material 100 places no significant stress on the underlying wafer substrate 150 or other portions of the semiconductor wafer 170.

Continuing with reference to FIG. 2, the PBZ based underfill material 100 shown is a visually transparent coating that completely covers the conductive bumps 160 of the semiconductor wafer 170. The covered conductive bumps 160 can be seen in FIG. 2 due to the transparency of the PBZ based underfill material 100. In one embodiment, the conductive bumps 160 extend upward from the surface of the wafer substrate 150 to a height of about 125 microns. In this embodiment, the coating of PBZ based underfill material 100 will be about 130 microns thick. In other embodiments, other feature sizing is employed. Embodiments include conductive bumps 160 of between about 50 microns and about 250 microns in height. These embodiments include a coating of PBZ based underfill material 100 reaching a thickness of up to about 50 microns in excess of the height of the underlying conductive bumps 160.

Figure 3:
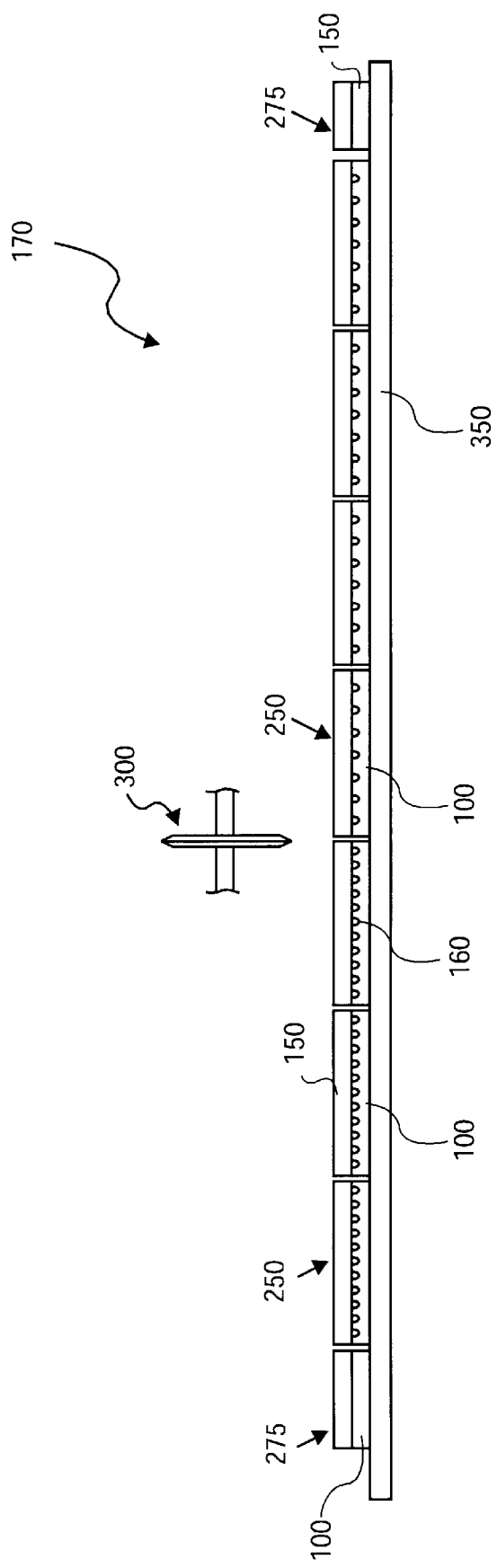
FIG. 3 is a side view of the wafer of FIG. 2, sawed into individual chips.

Referring to FIG. 3, the individual chips 250 of the semiconductor wafer 170 are distinguishable as they are separated by sawing. Each chip 250 includes portions of the wafer substrate 150 and the coating of PBZ based underfill material 100, as do nonfunctional wafer portions 275 (see also FIG. 2). However, the chips 250 also include internal circuitry electrically coupled to conductive bumps 160. As shown in FIG. 3, the conductive bumps 160 are of a height that is less than the thickness of the PBZ based underfill material 100.

The PBZ based underfill material 100 is cooled and solidifies as described above. In one method of separating individual chips 250 from one another, sawing tape 350 is attached to the semiconductor wafer 170 at the surface of the PBZ based underfill material 100 as shown at 760 of the flowchart of FIG. 7. The semiconductor wafer 170 is placed in a conventional sawing apparatus where a wafer saw 300 saws through the semiconductor wafer 170 to separate individual chips 250 as seen at 770 of FIG. 7. In one embodiment, the wafer saw 300 includes a diamond blade to promote a clean cut through common materials of a semiconductor wafer 170, such as silicon. In sawing through the semiconductor wafer 170, the wafer saw 350 does not saw through the sawing tape 350. In this manner, the chips 250 are separated from one another, yet remain securely in place on the sawing tape 350. In an alternate embodiment, the sawing tape 350 is placed at the opposite surface of the semiconductor wafer 170.

As the semiconductor wafer 170 is separated into individual chips 250, care is taken to avoid damage to the chips 250 such as cracking and other deformations. Additionally, embodiments of PBZ based underfill material 100 employed are particularly adept at avoiding the uptake of moisture. As a result, the PBZ based underfill material layer 100 is more likely to maintain its integrity and avoid fracture as compared to a cured and solidified conventional epoxy adhesive during sawing. By way of comparison, the PBZ based underfill material 100 uptakes moisture at no more than about 2% by volume, preferably no more than about 1.5%, as compared to conventional epoxy adhesive which tends to uptake at least about 3%.

In another embodiment, the PBZ based underfill material 100 includes a higher tensile strength and modulus than that found in conventional epoxy adhesives. For example embodiments of PBZ based underfill material 100 are from about 120 MPa to about 140 MPa, preferably about 130 MPa in tensile strength, and from about 3 GPa to about 5 GPa, preferably about 4 GPa in modulus. Conventional epoxy adhesive on the other hand generally has a tensile strength that does not exceed about 120 MPa and a modulus that does not exceed about 3 GPa. Additionally, conventional epoxy adhesive cannot be modified to increase strength and fracture resistance without increasing viscosity further hindering a uniform spread over an entire wafer surface as an underfill coating.

Figure 4:
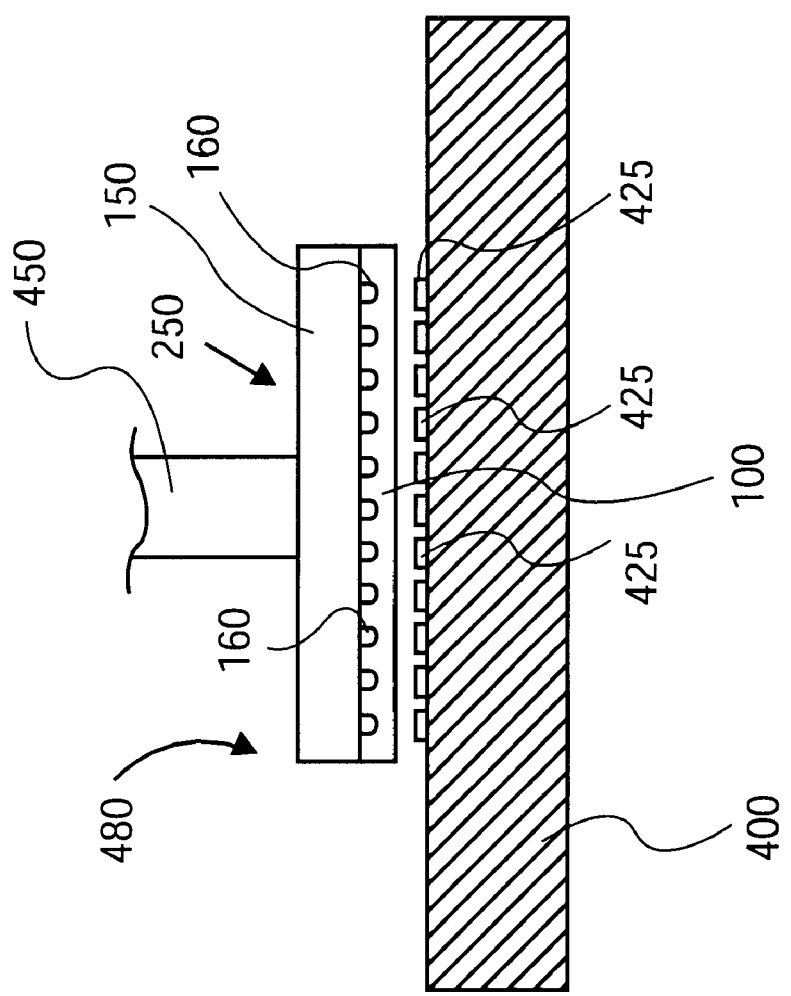
FIG. 4 is a partially sectioned side view of a chip of FIG. 3 placed at a surface of a package substrate.

Referring to FIG. 4, the arm 450 of a conventional pick and place mechanism delivers a functional chip 250 to a coupling portion 480 of the package substrate 400 as shown at 780 of the flowchart of FIG. 7. The coupling portion 480 includes bond pads 425 to electrically couple to the conductive bumps 160 extending from the chip substrate 150. The bond pads 425 may be wired to conductive pins 675 extending from the completed package 600 once completed (see FIG. 6).

As shown in FIG. 4, the conductive bumps 160 are covered by the PBZ based underfill material 100 and not immediately able to contact the bond pads 425. However, once the chip 250 is placed as shown, the package substrate 400 and chip 250 undergo reflow as described below, to physically and electrically couple the chip 250 and package substrate 400.

Figure 5:
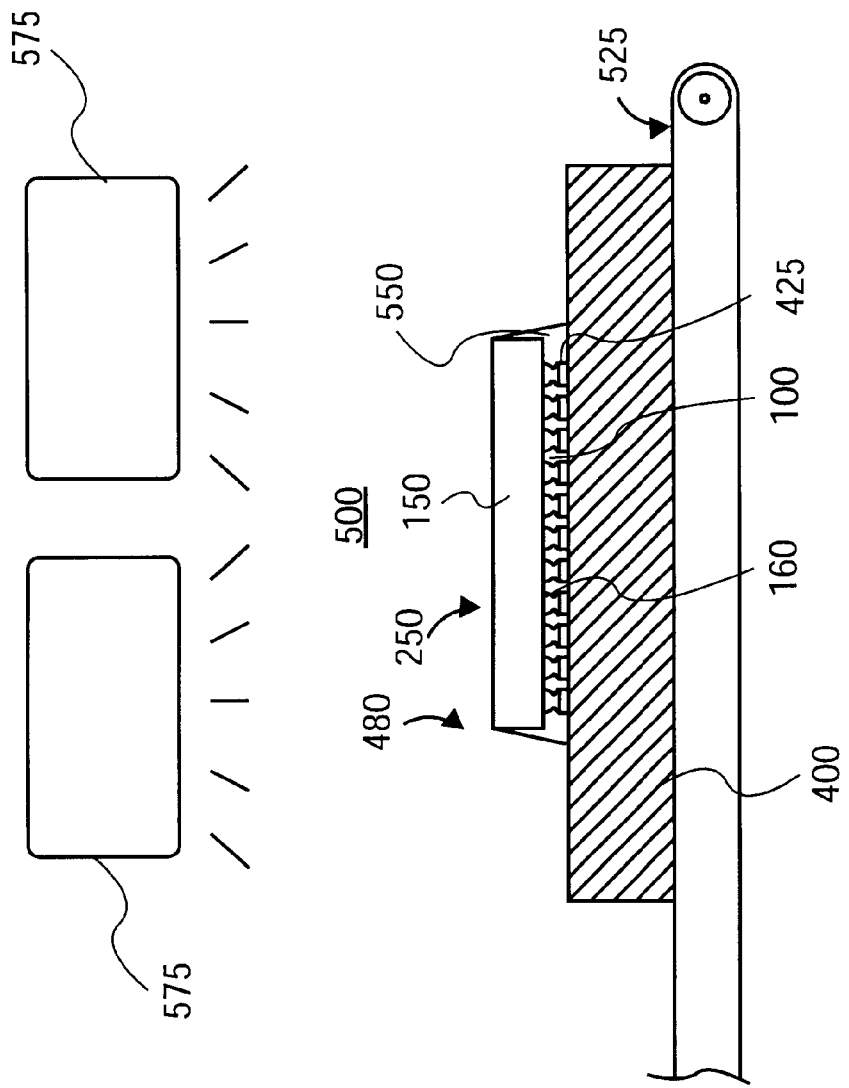
FIG. 5 is a partially sectioned side view of the chip and package substrate of FIG. 4 within a reflow apparatus.

Referring to FIG. 5, once the chip 250 is properly positioned on the package substrate 400, the package substrate 400 and chip 250 are placed in a reflow apparatus 500 as shown at 790 of the flowchart of FIG. 7. The reflow apparatus 500 may be a conventional semiconductor processing oven. In the embodiment shown, the package substrate 400 and chip 250 are advanced along a conveyor belt 525 of the reflow apparatus 500. As the chip 250 and package substrate 400 are advanced, the reflow apparatus 500 heats the conductive bumps 160, PBZ based underfill material 100 and other portions of the chip 250. The heat is provided by heating elements 575. The heating elements 575 may include heated coils, a radio frequency source, or other source of radiation. Additionally, other mechanisms of reflow may be used to heat the conductive bumps 160 and PBZ based underfill material 100.

Other portions of the chip 250 and the package substrate 400 are of materials having a melting point that exceeds the melting points of the PBZ based underfill material 100 and the conductive bumps 160. Therefore, as described below, the package substrate 400 and the chip 250 are physically and electrically coupled as the PBZ based underfill material 100 and conductive bumps 160 melt, with fluxing of the PBZ-based underfill material 100 taking place.

As the reflow apparatus 500 provides an increasing level of heat to the chip 250 and package substrate 400, the melting point of the PBZ based underfill material 100 is surpassed until a curing point is reached between about 125° C. and about 225° C. and curing begins. The PBZ based underfill material 100 liquefies and reforms below the chip 250. As the PBZ based underfill material 100 reforms it rises around the sides of the chip 250 in the form of protective side portions 550. Again, as described above, as the PBZ based underfill material 100 and the chip 250 are heated, the PBZ based underfill material 100 displays a CTE that more closely resembles a CTE of the conductive bumps 160 than would a conventional epoxy adhesive. As a result, stress from expansion of underfill material during heating is again reduced. In the case of wafer-level packaging this stress reduction is advantageous during both the dispensing of the PBZ based underfill material 100 to a semiconductor wafer 170 (see FIG. 1) and during reflow applied to a chip 250 and package substrate 400 as shown in FIG. 5.

The liquefying of the PBZ based underfill material 100 allows the chip 250 and conductive bumps 160 to drop into contact with the bond pads 425 of the package substrate 400. The reflow apparatus 500 continues to heat the chip 250 and package substrate 400 with the melting point of the conductive bumps 160 eventually being reached, for example at about 180° C. As the conductive bumps 160 reach their melting point they begin to flux and reform about the bond pads 425. In an embodiment where the conductive bumps 160 are of a lead-free solder such as tin silver or tin silver copper, a melting point of greater than about 200° C. may be found to ensure melting of the conductive bumps 160 after the PBZ based underfill material 100.

The package substrate 400 and chip 250 are now removed from the reflow apparatus 500 and allowed to cool. The PBZ based underfill material 100 is adhered to the chip 250 and to the package substrate 400. The conductive bumps 160 are adhered to the bond pads 425 completing interconnects. Depending on the particular PBZ based underfill material 100 and material of the conductive bumps 160, among other factors, reflow and curing as described above may take place over the course of between about 45 minutes and two hours, preferably about one hour.

As indicated above, the PBZ based underfill material 100 does not significantly shrink during cooling due to minimum gelling and curing during the dispensing process. Therefore, stress to the package substrate 400 and the chip 250 resulting from underfill shrinkage is again avoided when the PBZ based underfill material 100 is used. Thus, in the case of wafer-level packaging the avoidance of shrinkage is advantageous during the cooling following initial delivery of PBZ based underfill material 100 and again following reflow.

Figure 6:
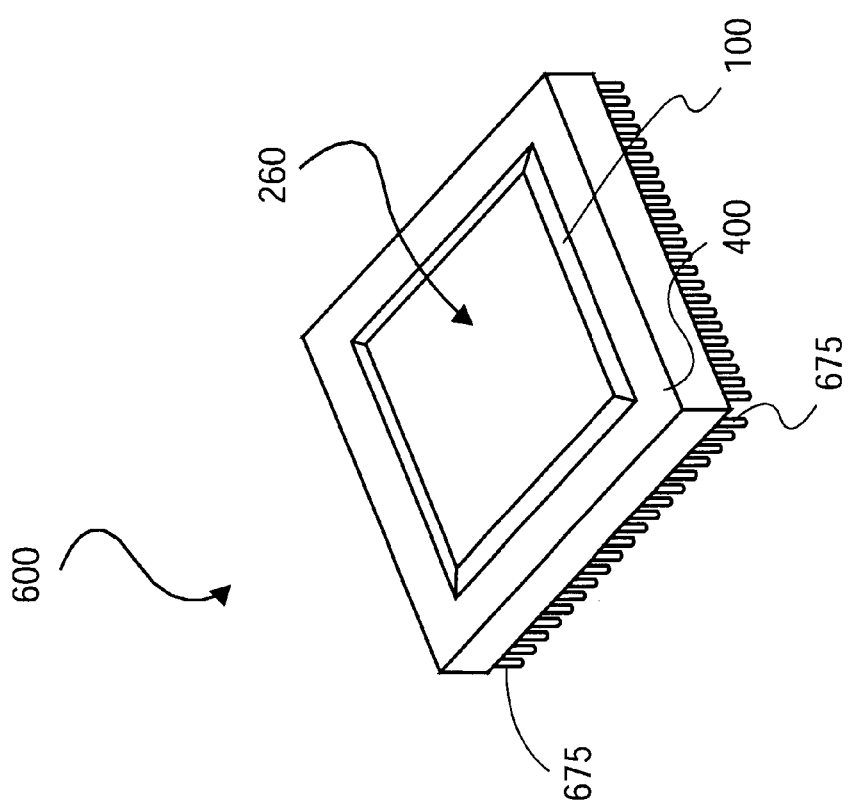
FIG. 6 is a perspective view of the package substrate of FIG. 5 incorporated into an assembled package.

Referring to FIG. 6, conductive pins 675 are shown coupled to the package substrate 400 to form a completed package 600. The competed package 600 is an area array package in the form of a pin grid array with conductive pins 675 of copper or other metal. However, in other embodiments a ball grid array or other non-hermatic package forms may be utilized. Additionally, embodiments may employ hermatic or peripheral array packaging.

The conductive pins 675 are electrically coupled to the bond pads 425 (see FIG. 5). This allows access to the circuitry of the chip 250 by devices coupled to the package 600 through the conductive pins 675. For example, the conductive pins 675 may plug into a printed circuit board of a device.

Referring to FIG. 7, a summary of a method of wafer-level packaging is shown in the form of a flowchart as also referenced herein above. A semiconductor wafer is positioned on a spinning mechanism 710. The semiconductor wafer may then be heated 720 and the spinning mechanism activated 730. A PBZ based underfill material is then introduced 740 to a surface of the semiconductor wafer. Alternatively, the PBZ based underfill material may be introduced 735 prior to activation of the spinning mechanism 745.

Once the PBZ based underfill material is delivered the semiconductor wafer is removed and cooled 750. Sawing tape is applied to semiconductor wafer 760 and the semiconductor wafer is sawed into individual chips 770. A pick and place mechanism delivers a chip to a package substrate 780. A reflow apparatus is then used to heat and cure leaving the chip physically and electrically coupled to the package substrate in a safe and secure manner 790.

PBZ based materials include the advantages of high fracture resistance along with negligible shrinkage and low CTE as described above. Additionally, PBZ materials can be heated to reduce viscosity, liquefied and uniformly spread without gelling or curing to the wafer surface. These features make PBZ based materials ideal for use in wafer-level packaging.

Embodiments described above include wafer-level underfill material. Additionally, methods of application and packaging are described. Although exemplary embodiments describe particular PBZ based underfill material and properties, additional embodiments are possible. For example, PBZ based underfill materials may be employed displaying lower chlorine content and longer pot-life during wafer-level packaging as compared to conventional epoxy adhesive. Additionally, many changes, modifications, and substitutions may be made without departing from the spirit and scope of these embodiments.

We claim:

1. An apparatus, comprising:
   a semiconductor wafer having a plurality of identical integrated circuits replicated thereon;
   a plurality of electrical contacts formed on a surface of the wafer, the electrical contacts being electrically coupled to the integrated circuits and extending to a first height above the surface of the wafer; and
   a layer of polybenzoxazine material on the surface of the wafer, the layer extending to a second height above the surface of the wafer, the second height being at least the first height.

2. The apparatus of claim 1, wherein the first height is between 50 and 250 microns and the second height is between 50 and 300 microns.

3. The apparatus of claim 2, wherein said polybenzoxazine material has a property selected from a group consisting of a melting point between about 50° C. and about 100° C. a curing point between about 125° C. and about 225° C. a Coefficient of Thermal Expansion between about 50 ppm/° C. and about 60 ppm/° C., and a modulus between about 3GPa and about 5GPa.

4. The apparatus of claim 2, wherein said polybenzoxazine material comprises:
   a polybenzoxazine resin;
   a hardener resin; and
   a catalyst.

5. The apparatus of claim 2, wherein said polybenzoxazine material has a capacity to absorb moisture that does not exceed about 2% by volume.

6. The apparatus of claim 2, wherein said polybenzoxazine material has a capacity to display substantially negligible shrinkage when cooled from a melting point of said material to a temperature below said melting point.

7. The apparatus of claim 2, wherein said polybenzoxazine material is selected from a group consisting of a polybenzoxazine polymer, a polybenzoxazine co-polymer and a mixture that includes a filler.

8. The apparatus of claim 2, wherein said polybenzoxazine material displays substantially negligible shrinkage when cooled from a temperature above room temperature to about room temperature.

9. The apparatus of claim 2, wherein said polybenzoxazine material has a tensile strength of between about 120 MPa and about 140 MPa.

10. The apparatus of claim 7, wherein said polybenzoxazine co-polymer includes at least one of a cyanate ester substance and a bismaleimide substance.

11. The apparatus of claim 7, wherein said filler of said mixture includes at least one of silicon oxide, alumina oxide, and boron nitride.

12. The apparatus of claim 1, wherein the layer of polybenzoxazine material is adjacent to the electrical contacts.

13. The apparatus of claim 12, wherein the layer of polybenzoxazine completely covers the electrical contacts.

* * * * *